United States Patent [19]

Brian

[11] Patent Number: 4,549,165
[45] Date of Patent: Oct. 22, 1985

[54] DYNAMIC VOLTAGE REFERENCE APPARATUS FOR A/D CONVERTERS

[75] Inventor: Michael Brian, Garland, Tex.

[73] Assignee: Rockwell International Corporation, El Segundo, Calif.

[21] Appl. No.: 623,737

[22] Filed: Jun. 22, 1984

[51] Int. Cl.$^4$ .............................................. G08C 9/00
[52] U.S. Cl. ............................................. 340/347 CC
[58] Field of Search ................. 340/347 CC, 347 AD

[56] References Cited

U.S. PATENT DOCUMENTS

| | | | |
|---|---|---|---|
| 4,186,384 | 1/1980 | Acker | 340/347 CC |
| 4,295,089 | 10/1981 | Cooperman | 340/347 AD |
| 4,364,006 | 12/1982 | Makabe et al. | 340/347 CC |
| 4,384,278 | 5/1983 | Benjamin | 340/347 AD |
| 4,454,500 | 6/1984 | Kato et al. | 340/347 AD |

Primary Examiner—William M. Shoop, Jr.
Assistant Examiner—Sharon D. Logan
Attorney, Agent, or Firm—Bruce C. Lutz; V. L. Sewell; H. Fredrick Hamann

[57] ABSTRACT

When an A/D converter is converting a multilevel analog signal into a plurality of distinct digital words, it needs to have a very accurate reference voltage which is tied to the voltage levels of the analog signal being converted for high accuracy. The present invention takes the most significant bit and an error bit signal from the analog-to-digital converter and logically combines these signals in such a way that error feedback signals are generated which are integrated over the long term and used to adjust the reference voltages supplied to the analog-to-digital converter wherein the feedback error signals average to zero.

8 Claims, 11 Drawing Figures

DYNAMIC VOLTAGE REFERENCE APPARATUS FOR A/D CONVERTERS

THE INVENTION

The present invention is generally related to electronics and more specifically to analog-to-digital converters. Even more specifically, the present invention is related to a circuit for dynamically adjusting the reference voltages used by a multilevel A/D converter wherein any long term errors in the conversion process for a given level are reduced to zero.

BACKGROUND

In the prior art, the amplitude of the analog signal being converted has been automatic gain controlled to a given reference level for its maximum and minimum amplitudes. However, it is difficult to change the gain of a signal without detrimentally affecting its bandwidth.

The present approach of logically detecting and combining the digital bits of the converted signal in such a manner that a determination can be made as to whether the A/D converter reference voltage should be raised or lowered to improve the conversion accuracy, eliminates any problems with altering bandwidth. Additionally, the automatic gain control circuitry and bandwidth compensation circuitry is eliminated and the savings in circuitry accordingly reduces expense of the total apparatus.

It is therefore an object of the present invention to provide an improved method of compensating for varying analog multilevel representative signals by adjusting the reference voltages to an analog-to-digital converter.

Other objects and advantages of the present invention may be ascertained from a reading of the specification and appended claims in conjunction with the drawings wherein:

Figure 1:
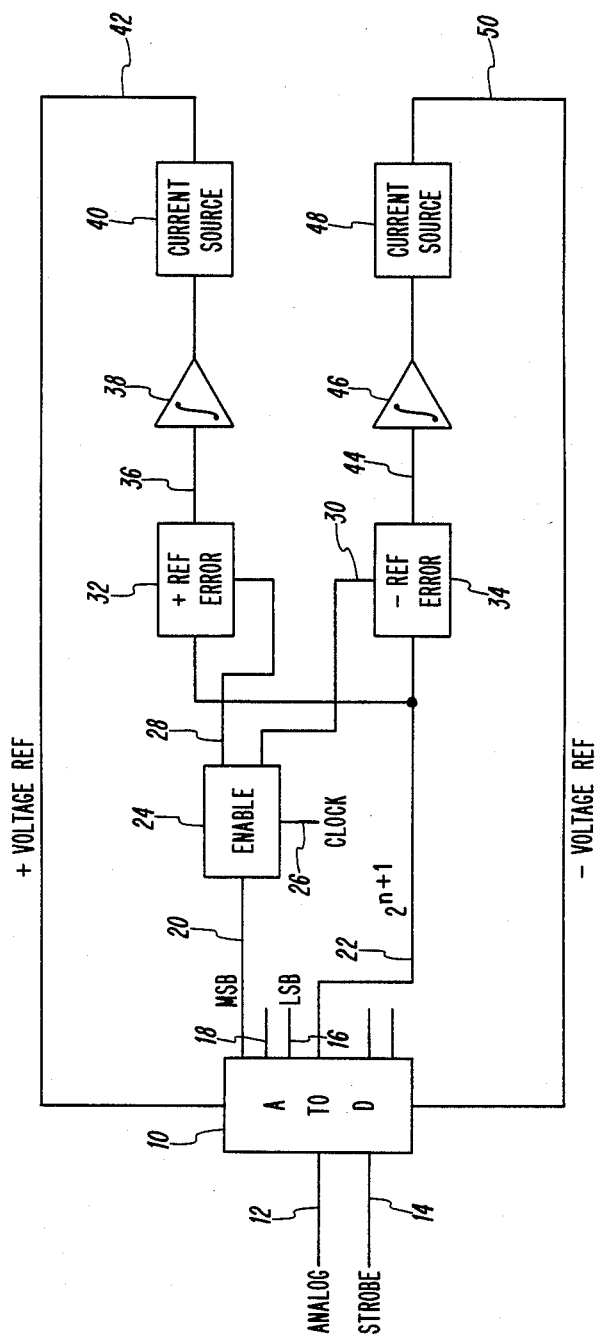
FIG. 1 is a block diagram of the present inventive concept.
Figure 2:
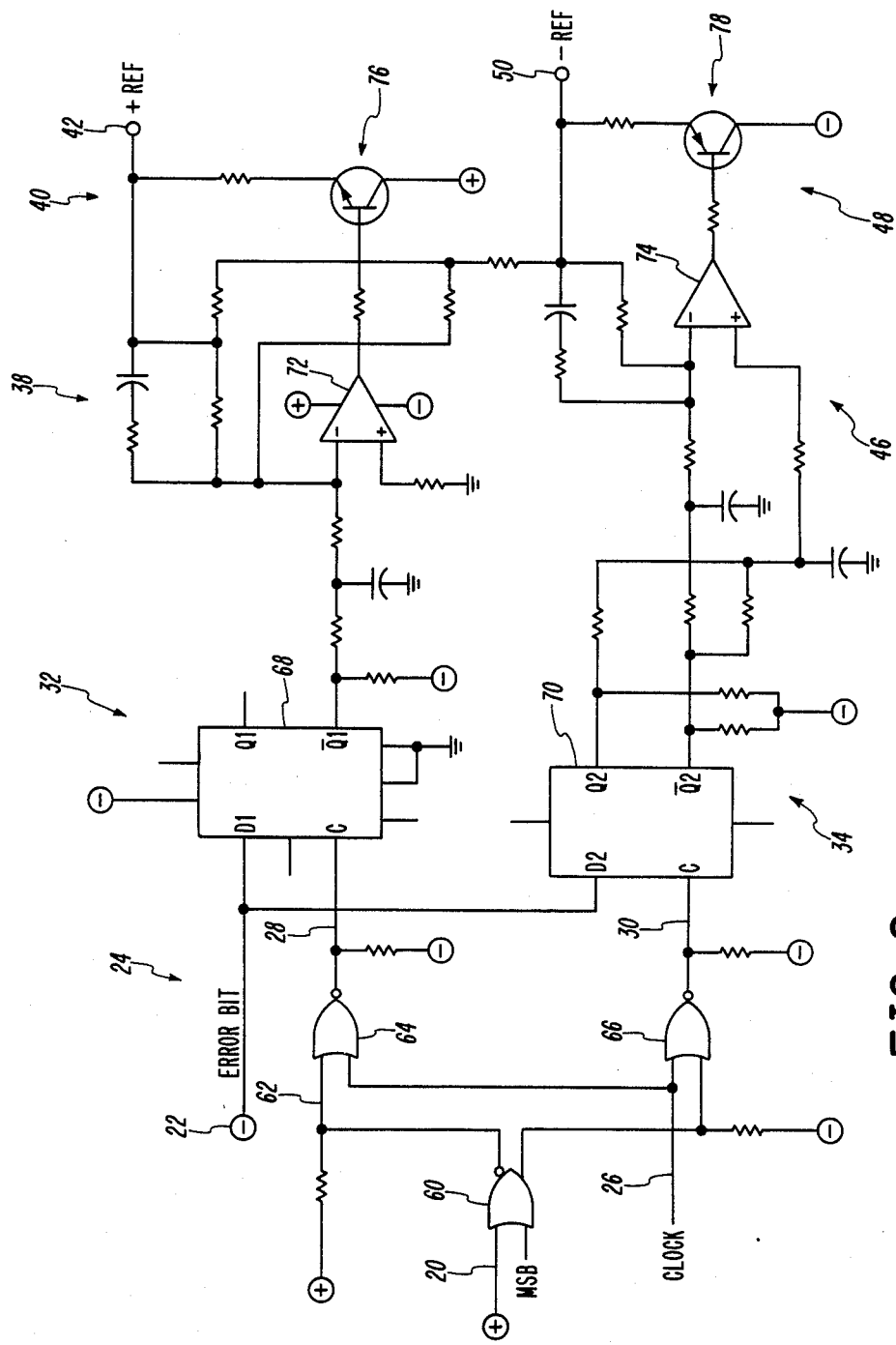
FIG. 2 is a detailed circuit diagram of the logic portion of FIG. 1.

FIGS. 3a through 3j comprise a set of waveforms used in explaining the operation of FIGS. 1 and 2.

DETAILED DESCRIPTION

In FIG. 1 an analog-to-digital converter 10 has a multilevel analog input signal supplied on a lead 12 and a strobe signal supplied on a lead 14. The output digital words from the least significant bit to the most significant bit are shown on leads 16, 18 and 20. The bit which is next most significant below the least significant output word bit appears on lead 22 and will be referred to hereinafter as the error bit. Lead 20 is supplied to an enable block 24 which also receives a clock on a lead 26. The clock on lead 26 is similar to that of strobe 14 but is somewhat different in phasing as will be ascertained from FIGS. 3b and 3e. Enable block 24 has output leads 28 and 30 supplied to positive and negative reference error blocks 32 and 34, respectively. The lead 22 is also supplied to both blocks 32 and 34. Reference error block 32 supplies output signals on a lead 36 to an integrator 38 which is connected to supply signals to a current source 40. Positive or "+" voltage reference signals are supplied on a lead 42 from current source 40 to the positive reference voltage input terminal of A/D converter 10. The negative reference error block 34 supplies signals on a lead 44 to an integrator 46 which controls a current source 48. Current source 48 supplies negative or "−" voltage reference signals on a lead 50 connected to the negative reference input terminal of the A/D converter 10.

In FIG. 2 the same numbers as used in FIG. 1 are used where appropriate. As illustrated, the lead 20 is supplied to a NOR gate 60 having an inverted output supplying signals on a lead 62 to a NOR gate 64. A non-inverted output of NOR gate 60 is supplied to a NOR gate 66. The clock input 26 is supplied to both of the NOR gates 64 and 66. The three NOR gates 60, 64 and 66 comprise the enable block 24 of FIG. 1. As illustrated, these two NOR gates 64 and 66 supply signals on leads 28 and 30, respectively, to the clock inputs of a D flip-flop 68 and a D flip-flop 70, respectively. Lead 22 supplies error bit signals to the D inputs of flip-flop 68 and 70. The $\overline{Q}$ output of flip-flop 68 is supplied through a plurality of resistors to a negative or inverting input of an operational amplifier 72 having several feedback paths as illustrated. Operational amplifier 72 and its associated circuitry performs an integration function. The $\overline{Q}$ output of D flip-flop 70 is connected to the negative or inverting input of an operational amplifier 74 which provides a second integration function through the various feedback paths. Both the Q and $\overline{Q}$ outputs of flip-flop 70 are connected through a series of resistors to perform a reference voltage function for connection to the positive or non-inverting input of operational amplifier 74. There is no logic function performed with this input but merely serves as a convenient way of providing a stable voltage reference to operational amplifier 74 used in the integrating environment. An output of operational amplifier 72 in integrator 38 is supplied to an NPN transistor generally designated as 76 and forming an active portion of the current source 40. An output of operational amplifier 74 is supplied to a PNP transistor 78 forming an active part of the current source 48. Transistor 76 provides a variable impedance or voltage dropping function between a positive power supply and the positive reference input of the A/D converter 10 of FIG. 1. Likewise, transistor 78 provides a variable resistance impedance or voltage dropping function between a negative power terminal and the negative reference input of the A/D converter 10 of FIG. 1. While the circuit is constructed so that the negative and positive reference sources can be and are independently adjusted, a typical situation is that the analog signal being received is proportionately altered and thus the two outputs on leads 42 and 50 alter or vary in reasonably close and complementary fashions.

In FIG. 3a the magnitude of the errors have been amplified for explanation purposes and typically would not reach the extremes illustrated. In FIG. 3a a waveform 100 is illustrated representing the analog input provided on lead 10 of FIG. 1. The desirable positive voltage level for the amplitudes of the analog signal is labeled 102 while the desirable negative voltage level for the amplitudes of the analog signal is represented as 104. The actual positive voltage level is illustrated as designated by 106 while the actual negative level is designated 108. A strobe signal is represented as 14' in FIG. 3b while the most significant bit appearing on lead 20 of FIG. 1 is represented in FIG. 3c by 20'. This is one of the bits used in the logic circuitry to generate the reference voltages. The error bit is represented by waveform 22' in FIG. 3d and is representing that appearing on lead 22 of FIG. 1. The clock signal appearing on lead 26 is represented by waveform 3E and designator 26'. The output from enable block 24 is shown in waveform 3F as 28' while the waveform appearing on lead 36 to be integrated is shown in waveform 3G as signal 36'. Waveform 3H illustrates the signals appearing on lead 30 and thus is designated 30' while the signals on lead 44 are illustrated in waveform 3J. These signals shown as 44' are those to be integrated by the negative feedback integrator 46. The center line of the waveform 100 is shown as 110 and it will be noted that the most significant bit is always a logic 1 above this center line while it is always a logic 0 below the center line. The signal being detected has eight possible values and if the reference voltage is too large proportionately to the actual amplitude of the signal being converted, then the error bit signal represented by the fourth bit will normally be a logic 0 for the conditions above the center line or when the most significant bit is a logic 1 and will normally be a logic 1 for conditions below the center line or where the most significant bit is a logic 0. Conversely, if the reference voltage level is less than the desirable amount for the amplitude of the analog signal, the fourth bit or error bit signal will be a logic 1 for those signals appearing above the center line and a logic 0 for those signals appearing below the center line. These conditions are used in a logical manner to generate the signals to be integrated and used as feedback signals for controlling the reference voltage levels to the analog-to-digital converter as part of the present inventive concept.

OPERATION

Figure 3:
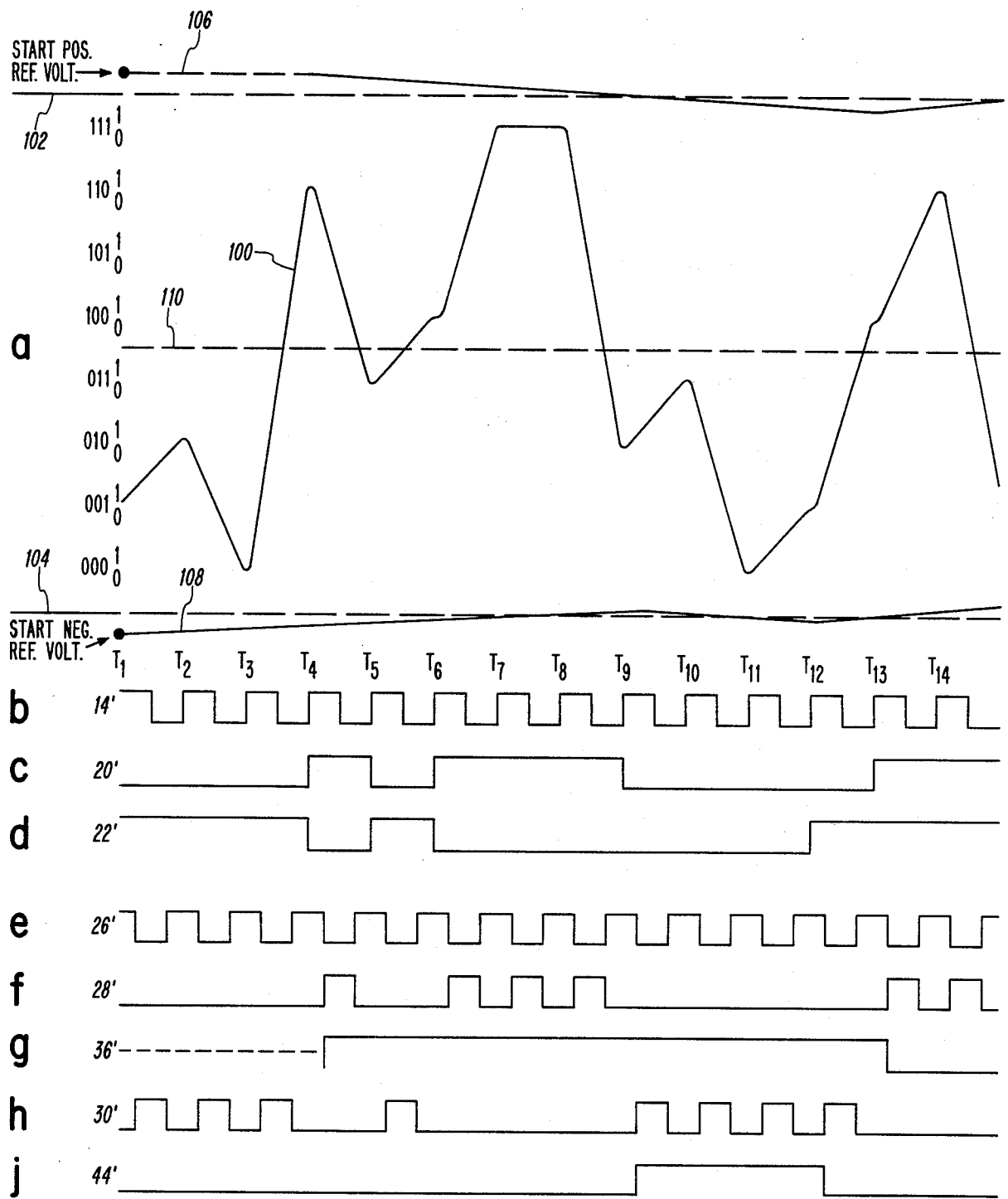

In explaining the operation of the inventive concept, reference will be first made to FIGS. 2 and 3. At time T2, the analog signal is below the center line and thus if the reference voltage applied to the analog-to-digital converter were as desirably illustrated by lines 102 and 104, the output signal would be 010 for the first three bits and the fourth bit would statistically vary between 1 and 0 due to small perturbations on the incoming signal or the voltage reference. These statistical variations would average out to 0. However, it is assumed for the purposes of discussion, that the actual negative voltage is that shown by 108. Under these conditions, the absolute value of the analog signal 108 will produce a decoded output of 0101. This signal, as appears on the waveform of FIG. 3d, remains at a logic 1 as has occurred on the previous occasions since, as illustrated, the reference voltage had a considerable negative error. The most significant bit, being a logic 0, is applied to the NOR gate 60 and produces a logic 1 output on lead 62 since this is inverted and produces a logic 0 as applied to NOR gate 66. When the clock on lead 26 next becomes a logic 0, an output is produced from NOR gate 66 on lead 30 as shown in waveform 3H. The positive going side of waveform H clocks the flip-flop 70 but since the incoming signal on lead 22, as illustrated in FIG. 3d, is positive and has been so, the output on the $\overline{Q}$ output of flip-flop 70 remains at the negative potential as illustrated in waveform 44' of FIG. 3j. In fact, the output of flip-flop 70 remains the same until the negative reference voltage decreases to less than the desirable amount as starts to happen at time period T8. Thus, at time period T9 which is the first time that the analog signal falls below the center line after the negative reference voltage has been over-compensated, a pulse is passed through the flip-flop 66 to produce the appropriate signal immediately after time period T9 on waveform 30'. This waveform on 30' clocks D flip-flop 70 so as to pass the error bit signal appearing on lead 22. Since this signal is negative as shown in the waveform of FIG. 3D, the inversion thereof on the $\overline{Q}$ output produces a positive output to be integrated by integrator 74 and start the correction process for the negative reference voltage. It will be noted that immediately after application of this logic 1 output in waveform 3J, the signal represented by line 108 starts in the opposite direction. As soon as the waveform 108 again becomes more negative than the desirable amount, the integrated input to integrator 74 ceases, as shown, immediately after time period T12. Thus, the actual negative reference level is again compensated towards the more desirable level as indicated by 104.

A similar process occurs on the positive side commencing at time period T4. Prior to this time, the waveform output from the flip-flop 68 is undeterminable but may be assumed to be negative for a point of reference. At time period T4, the most significant bit is a logic 1 and this is passed through the NOR gate 60 to lead 62 where it is a negative signal due to the inverter at the output of NOR gate 60. The NOR gate 64 immediately after time period T4 has two negative or logic 0 inputs and thus produces a logic 1 output as illustrated in waveform 28' in FIG. 3f. This positive going pulse is used to actuate the clock of flip-flop 32 and pass the error bit appearing on lead 22 to the output in inverted form. Since the positive reference has been assumed to be too large, the signal appearing at time T4 would be slightly less than that which would be apparently the correct value. Thus, the error bit signal appearing on lead 22 would be a logic 0. This logic 0 signal is inverted by the D flip-flop 68 to produce a positive output signal to be integrated by the integrator 38. This signal is shown in waveform 3G as waveform 36'. Thus, the amplitude of the positive reference potential is decreased until the next positive analog signal occurrence where the actual reference voltage is less than the desirable amount for the assumed analog signal relative values. As will be ascertained, at time period T6 when the analog signal being converted is again above the center line, the positive pulse of waveform 28' does not affect anything but merely leaves the output of the flip-flop 68 at a logic 1 level. However, at time period T13, the positive output pulse of waveform 28' immediately after time period T13, causes the positive input of the error bit or logic 1 value of the error bit, to be inverted and thus provide a logic 0 to the integrator to again return the actual reference level voltage towards the desirable value.

As will be observed, the integrated inputs shown in waveforms of FIGS. 3g and 3j are applied to the integrators 38 and 46, respectively. The outputs of these integrators are used to adjust the voltage drop of the transistor 76 and 78, respectively, so as to adjust the positive and negative reference voltages as applied to the A/D converter 10 of FIG. 1.

As will be apparent from the discussion, relative FIGS. 2 and 3, the circuit of FIG. 1 is a circuit for adjusting the reference input voltages to the A/D converter 10. The dynamic adjustment of these reference voltages affects the interpretation of the analog input supplied on lead 12 in relation to the digital word output since the analog converter can only operate to interpret the analog input relative its reference voltages. If the input voltage is larger than desirable for the amplitude of the signal being converted, the output word will be too small. Thus, as previously indicated, either the amplitude of the analog input signal needs to be adjusted towards a desired maximum value or the reference voltage used by the analog-to-digital converter needs to be adjusted toward the analog maximum value. By adjusting the reference voltages to the analog-to-digital converter in accordance with the logical detection illustrated in FIG. 2, these voltages can be adjusted to follow long time variations in the amplitude of the analog input signal. The integrators 38 and 46 are utilized for stability and produce the changes shown in FIG. 3 over a period of many hundreds of bits rather than the few bits used for description purposes.

While I have described one specific circuit implementation of the inventive concept, I wish to be limited not to the circuit shown, but only by the scope of the appended claims wherein I claim:

1. Dynamic voltage reference apparatus comprising, in combination:
    analog-to-digital (A/D) conversion first means, including signal input means, positive and negative voltage reference source means and digital word output means, for detecting analog signal input amplitude values with respect to a predetermined reference level;
    logic circuit second means, connected to said word output means of said first means for receiving error bit and most significant bit (msb) signals therefrom, for supplying positive and negative feedback signals from output means thereof; and
    reference voltage third means, connected between said first and second means, for integrating the feedback signals and adjusting the positive and negative voltage levels of reference signals applied to said first means toward a value which minimizes the average value of said feedback signals.

2. The method of adjusting reference voltage levels to a multilevel analog-to-digital (A/D) converter for minimizing signal level detection errors comprising the steps of:
    logically combining the most significant bit (msb) and a clock signal to provide one of a positive strobe signal and a negative strobe signal;
    logically combining an error bit signal and said positive and negative strobe signals to produce one of a positive and negative error feedback signal; and
    integrating said positive and negative error feedback signals to provide reference voltage signals for use by a multilevel A/D converter.

3. Dynamic voltage level supply apparatus for use with an analog-to-digital (A/D) signal converting device comprising, in combination:
    signal supplying first means for supplying most significant error and word bits output by a D/A converter as a result of an analog signal conversion;
    logic circuit second means, including error signal first and second output means and input means connected to said first means for receiving said most significant error and word bits therefrom, passing an inverted version of said error bit to said error signal first output means when the most significant bit is a logic one and passing an inverted version of said error bit to said error signal second output means when the most significant bit is a logic zero; and
    integrating third means, including first and second input means connected to said error signal first and second output means of said logic circuit second means and including controlled voltage output means, said integrating third means providing positive and negative voltage references for use by the D/A converter.

4. Apparatus as claimed in claim 3 comprising, in addition:
    D/A converter means, connected to said first and third means and including analog signal input means, for converting multilevel analog input signals to digital word and error bit output signals using the voltage levels obtained from said third means as a reference.

5. The method of compensating for errors introduced in the conversion of a multilevel analog signal having a discrete number of levels to a digital signal when the maximum possible analog signal level varies from any of its predefined absolute values comprising, the steps of:
    logically decoding the most significant digital word bit and the most significant error bit generated in an analog-to-digital conversion of the multilevel analog signal for generating a controlled amplitude comparison level reference signal; and
    using the controlled amplitude signal as a comparison level reference for converting the multilevel analog signal to one of the discrete number of possible digital values representing that analog value.

6. Compensation apparatus comprising, in combination:
    first means for supplying a multilevel analog signal to be converted to digital values, the analog signal having predefined intermediate values relative the maximum and minimum levels thereof although the maximum and minimum absolute may vary;
    analog-to-digital (A/D) conversion second means, including voltage reference signal means, digital signal word and error bit output means and signal input means connected to said first means, for converting multilevel analog signals received from said first means to digital bit words having digital values directly based on the received analog signal value relative the level of voltage reference signals supplied thereto; and
    feedback control means, connected between said digital word and error bit output means of said second means and said voltage reference signal means, for logically detecting the most significant bit of the digital word and the error bit values output by said second means at that time and controlling the level of the reference voltage supplied to said second means toward a value which provides an average error bit value of zero.

7. The method of compensating for variations in maximum amplitude of a previously amplitude modulated multilevel analog signal to be converted to a digital signal comprising, the steps of:
    detecting the digital logic value error bit output from the analog-to-digital (A/D) converter; and
    controlling the reference voltage level used by the A/D converter for directly outputting a digital word based on the relative amplitude of the analog signal to be converted and the reference voltage level to obtain an average digital error bit value of zero over a predetermined period of time.

8. Apparatus for compensating for variations in maximum amplitude of a previously amplitude modulated multilevel analog signal to be converted to a digital signal comprising, in combination:
    first means, connected to the output of an analog-to-digital converter for receiving error bit signals therefrom, for detecting a digital logic value error bit output from an analog-to-digital converter; and
    logical control second means, connected to said first means, for controlling the reference voltage level supplied to the analog-to-digital converter to obtain an average error bit value of zero.

* * * * *